United States Patent
Wang

(10) Patent No.: US 8,642,959 B2
(45) Date of Patent: Feb. 4, 2014

(54) METHOD AND SYSTEM OF PERFORMING THREE-DIMENSIONAL IMAGING USING AN ELECTRON MICROSCOPE

(75) Inventor: Shixin Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 778 days.

(21) Appl. No.: 11/926,791

(22) Filed: Oct. 29, 2007

(65) Prior Publication Data

US 2009/0108200 A1     Apr. 30, 2009

(51) Int. Cl.
*G01N 23/00*     (2006.01)

(52) U.S. Cl.
USPC ............ 250/311; 250/310; 250/307; 250/306

(58) Field of Classification Search
None
See application file for complete search history.

(56) References Cited

U.S. PATENT DOCUMENTS

| | | | |
|---|---|---|---|
| 2,991,391 A | 7/1961 | Weaver | |
| 3,889,114 A * | 6/1975 | Jan van Oostrum | 250/306 |
| 3,949,221 A * | 4/1976 | Liebl | 250/281 |
| 4,099,055 A * | 7/1978 | Todokoro | 250/311 |
| 4,209,698 A | 6/1980 | Hoppe | |
| 4,214,162 A * | 7/1980 | Hoppe et al. | 250/311 |
| 4,330,709 A | 5/1982 | de Chambost | |
| 4,352,015 A * | 9/1982 | Jore et al. | 250/311 |
| 4,427,886 A * | 1/1984 | Martin et al. | 250/310 |
| 4,482,843 A * | 11/1984 | Perring | 315/4 |
| 4,608,491 A * | 8/1986 | Kokubo | 250/311 |
| 4,870,321 A * | 9/1989 | Kamohara | 313/414 |
| 4,945,237 A * | 7/1990 | Shii et al. | 250/311 |
| 5,081,354 A * | 1/1992 | Ohhashi et al. | 250/311 |
| 5,124,556 A | 6/1992 | Takashima | |
| 5,162,695 A * | 11/1992 | Shimona et al. | 313/412 |
| 5,187,371 A * | 2/1993 | Matsui et al. | 250/396 R |
| 5,225,676 A * | 7/1993 | Matsuya | 250/311 |
| 5,298,757 A | 3/1994 | Okayama | |
| 5,336,891 A | 8/1994 | Crewe | |
| 5,412,277 A * | 5/1995 | Chen | 313/414 |
| 5,500,527 A * | 3/1996 | Zarubin | 850/9 |
| 5,834,783 A * | 11/1998 | Muraki et al. | 250/398 |
| 6,000,981 A | 12/1999 | Knox et al. | |
| 6,064,071 A | 5/2000 | Nakasuji | |

(Continued)

FOREIGN PATENT DOCUMENTS

| | | |
|---|---|---|
| EP | 1526563 | 4/2006 |
| GB | 665094 | 1/1952 |

(Continued)

OTHER PUBLICATIONS

Hiroshi Fujita, "Ultra-High Voltage Electron Microscopy: Past, Present, and Future," Journal of Electron Microscopy Technique 3:243-304 (1986), Alan R. Liss, Inc.

(Continued)

*Primary Examiner* — Andrew Smyth
(74) *Attorney, Agent, or Firm* — Leffert Jay & Polglaze, P.A.

(57) ABSTRACT

A method and electron microscope system of performing three-dimensional imaging using an electron microscope. At least some of the illustrative embodiments are methods comprising generating an electron beam, and creating a hollow-cone electron beam (by passing the electron beam through an annular aperture), focusing the hollow-cone electron beam to form a probe, scanning a specimen using the probe; and performing three-dimensional imaging based on the scanning.

26 Claims, 4 Drawing Sheets

(56) References Cited

U.S. PATENT DOCUMENTS

| | | |
|---|---|---|
| 6,384,412 B1 | 5/2002 | Krahl et al. |
| 6,410,923 B1 | 6/2002 | Crewe |
| 6,498,348 B2 | 12/2002 | Aitken |
| 6,570,163 B1 * | 5/2003 | El Gomati et al. ............ 250/397 |
| 6,836,373 B2 | 12/2004 | Hosokawa |
| 6,878,936 B2 | 4/2005 | Kienzle et al. |
| 7,002,160 B1 | 2/2006 | Glass et al. |
| 7,005,658 B2 | 2/2006 | Muraki |
| 7,034,271 B1 * | 4/2006 | Sinclair et al. ............ 250/201.3 |
| 7,075,078 B2 | 7/2006 | Ose et al. |
| 7,109,493 B2 | 9/2006 | Eastham |
| 7,173,243 B1 | 2/2007 | Yang et al. |
| 7,233,384 B2 * | 6/2007 | Venema et al. ................. 355/53 |
| 7,244,949 B2 | 7/2007 | Knippelmeyer et al. |
| 2003/0122087 A1 | 7/2003 | Muraki et al. |
| 2003/0132383 A1 | 7/2003 | Benner |
| 2003/0168606 A1 | 9/2003 | Adamec et al. |
| 2004/0081283 A1 | 4/2004 | Rand |
| 2004/0211919 A1 | 10/2004 | Tanaka et al. |
| 2005/0035290 A1 | 2/2005 | Saitoh |
| 2005/0116180 A1 | 6/2005 | Komagata |
| 2005/0199827 A1 | 9/2005 | Nagano |
| 2005/0259786 A1 | 11/2005 | Fantini et al. |
| 2006/0001349 A1 * | 1/2006 | Ishihara ....................... 313/414 |
| 2006/0071166 A1 | 4/2006 | Sato et al. |
| 2006/0169910 A1 | 8/2006 | Frosien et al. |
| 2006/0175548 A1 | 8/2006 | Kawasaki et al. |
| 2006/0185424 A1 | 8/2006 | Muckenhirn |
| 2006/0219912 A1 | 10/2006 | Ohtaki et al. |
| 2006/0219918 A1 | 10/2006 | Ezumi et al. |
| 2006/0226359 A1 | 10/2006 | Principe |
| 2006/0284084 A1 | 12/2006 | Morimoto et al. |
| 2006/0284088 A1 | 12/2006 | Fukunaga et al. |
| 2006/0284093 A1 | 12/2006 | Kamiya et al. |
| 2006/0289804 A1 | 12/2006 | Knippelmeyer et al. |
| 2007/0085020 A1 | 4/2007 | Kawada et al. |
| 2007/0090288 A1 | 4/2007 | Shemesh |
| 2007/0114403 A1 | 5/2007 | Hosokawa |
| 2007/0115468 A1 | 5/2007 | Barnard |
| 2007/0120065 A1 | 5/2007 | Takane et al. |
| 2007/0145267 A1 | 6/2007 | Adler et al. |
| 2007/0158567 A1 | 7/2007 | Nakamura et al. |
| 2007/0158568 A1 | 7/2007 | Nakamura et al. |
| 2007/0158576 A1 | 7/2007 | Kamikubo et al. |
| 2007/0176114 A1 | 8/2007 | Horsky et al. |
| 2007/0181805 A1 | 8/2007 | Mori et al. |
| 2007/0187598 A1 | 8/2007 | Tachibana et al. |
| 2007/0187599 A1 | 8/2007 | Abe et al. |
| 2007/0200069 A1 | 8/2007 | Frosien et al. |
| 2009/0127473 A1 * | 5/2009 | Kimura et al. ............ 250/396 R |

FOREIGN PATENT DOCUMENTS

| | | | |
|---|---|---|---|
| JP | 10275580 A | * | 10/1998 |
| JP | 2000294184 A | * | 10/2000 |
| JP | 2000-331797 | | 11/2000 |
| JP | 2002-110400 | | 4/2002 |
| JP | 2002-299217 | | 10/2002 |
| JP | 2006-012822 | | 1/2006 |
| JP | 2006-173027 | | 6/2006 |
| JP | 2006-278069 | | 10/2006 |
| JP | 2006-287013 | | 10/2006 |
| JP | 2007-012544 | | 1/2007 |
| JP | 2007-095576 | | 4/2007 |
| JP | 2007-134229 | | 5/2007 |
| WO | 2005008717 | | 1/2005 |

OTHER PUBLICATIONS

M. Hibino, H, Shimoyama, and S. Maruse, "A High-Voltage Scanning Transmission Electron Microscope at Nagoya University," Journal of Electron Microscopy Technique 12:296-304 (1989), Alan R Liss, Inc.

E. Munro, X. Zhu, M.R. Smith, S.R. Desbruslais and J.A Rouse, "Field Computation Techniques in Electron Optics", IEEE Transactions on Magnetics, vol. 26, No. 2, Mar. 1990.

S.K. Guharay, J. Orloff, Fellow, IEEE, and M. Wada, "Ion Beans and Their Applications in High-Resolution Probe Formation," IEEE Transactions on Plasma Science, vol. 33. No. 6, Dec. 2005.

B.L. Militsyn, C.A.J. Van Der Geer, W.H. Urbanus, "Transport of Electron Beams With Large Energy Spread in a Periodic Longitudinal Magnetic Field" Institute of Plasma Physics "Rijnhuizen", Trilateral Euregio Cluster, Association Euroaton-FOM, P.O. Box 1207, NL-3430BE Nieuwegein, The Netherlands; Proceedings of EPAC 2000, Viena, Austria.

Michiko G. Minty and Frank Zimmermann, "Beam Techniques—Beam Control and Manipulation," Lectures given at the US Particle Accelerator School, University of Chicago and Argonne National Laboratory, Jun. 14-25, 1999.

Gordon W. Hamilton and Martha Bacal, "Physics and Applications of Charged Particle Beam Sources," IEEE Transactions on Plasma Science, vol, 19, No. 6, Dec. 1991.

* cited by examiner

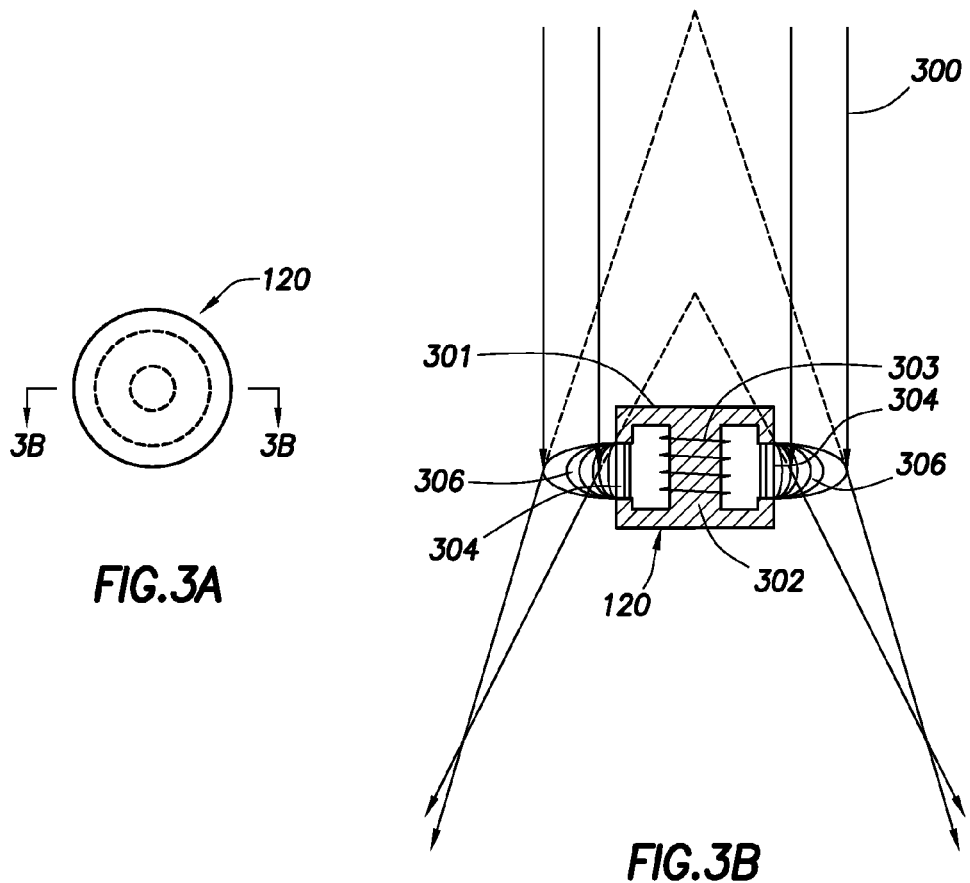
FIG.3A
FIG.3B
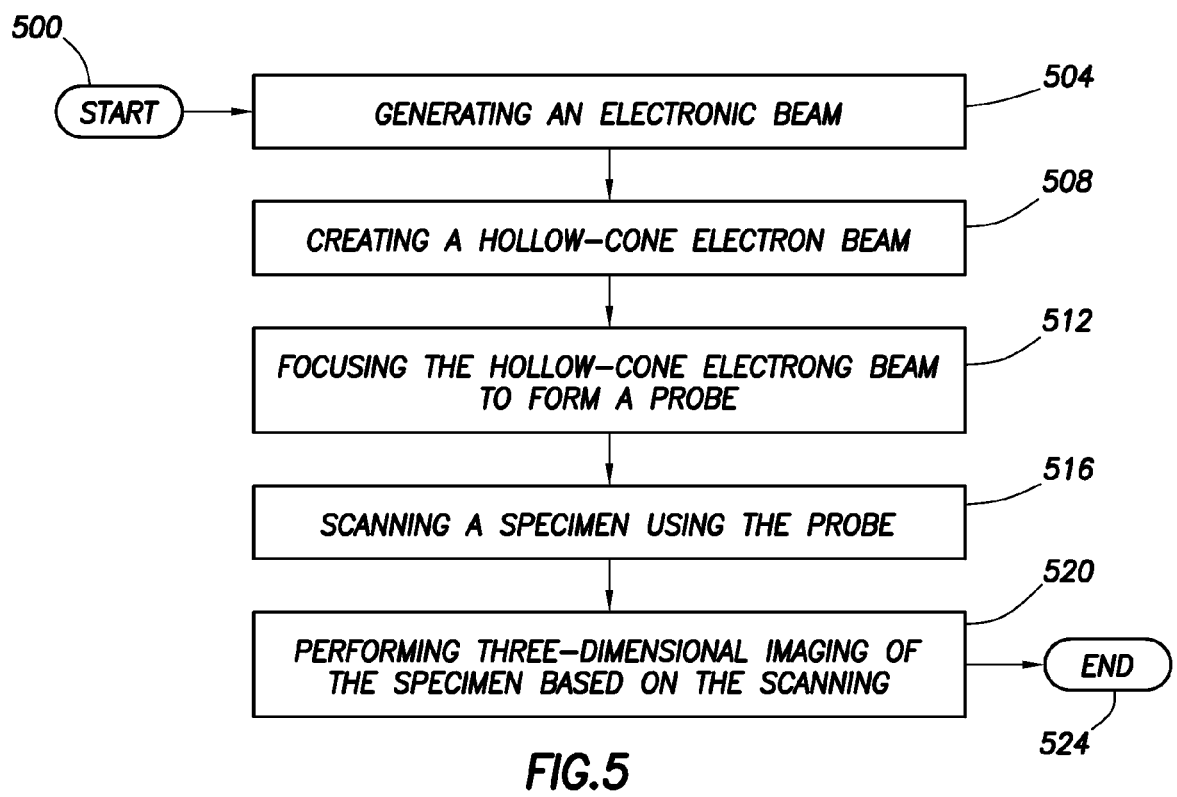
FIG.5

METHOD AND SYSTEM OF PERFORMING THREE-DIMENSIONAL IMAGING USING AN ELECTRON MICROSCOPE

BACKGROUND

1. Field

The various embodiments are directed to performing imaging of a specimen using an electron microscope.

2. Description of the Related Art

Electron microscopes are used in a variety of applications that require high resolution imaging and analysis. In particular, electron microscopes are used in applications such as metallurgy, crystallography, biological sciences, and the semiconductor industry. Any technology which increases the resolution offered by electron microscopes would be desirable.

BRIEF DESCRIPTION OF THE DRAWINGS

For a detailed description of various embodiments, reference will now be made to the accompanying drawings in which:

FIG. 3A shows a an overhead elevation view of a diverging lens in accordance with at least some embodiments;

FIG. 3B shows a cross-section elevation view of a diverging lens in accordance with at least some embodiments;

FIG. 5 shows a method in accordance with at least some embodiments.

NOTATION AND NOMENCLATURE

Certain terms are used throughout the following description and claims to refer to particular system components. As one skilled in the art will appreciate, design and manufacturing companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other intermediate devices and connections. Moreover, the term "system" means "one or more components" combined together. Thus, a system can comprise an "entire system," "subsystems" within the system, an electron microscope, a magnetic lens, or any other device comprising one or more components.

"Electron probe" refers to a volume enclosed by a substantially equal-intensity contour surface around a focus of an electron beam. One example of the intensity of the contour surface is an electron intensity substantially equal to half the electron intensity at the focus center.

"Vertical direction" refers to the direction parallel to the optical axis of an electron beam. "Horizontal direction" refers to the direction perpendicular to the optical axis of an electron beam.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
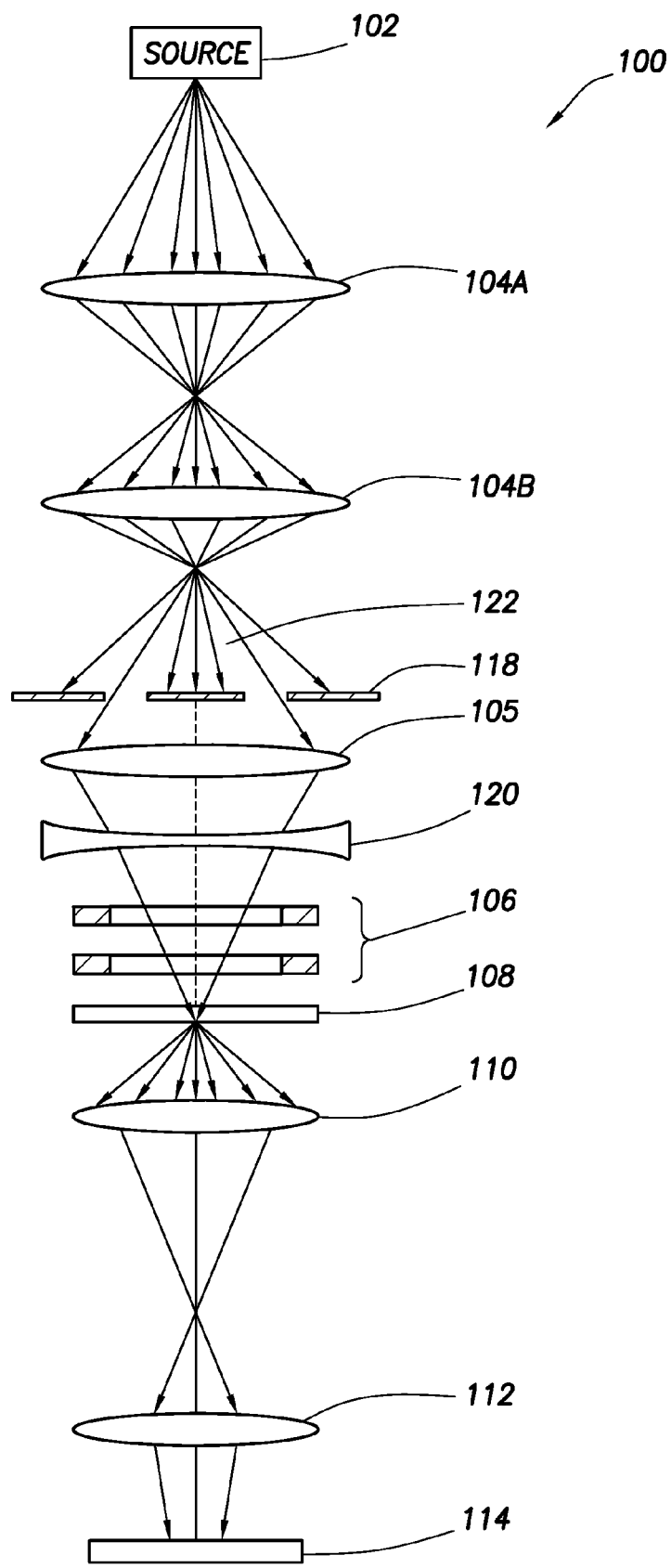
FIG. 1 shows a scanning transmission electron microscope (STEM) system in accordance with at least some embodiments.

FIG. 1 shows a system 100 in accordance with at least some embodiments. In particular, system 100 is an electron microscope (e.g., scanning transmission electron microscope (STEM)). An electron beam generated by the electron source 102 is focused onto specimen 108 using a series of converging magnetic lenses 104A-104B and 105. In the illustrative figures optical analogs of the magnetic lenses are shown for schematic purposes only. The electron source 102 accelerates the electron beam to a predetermined acceleration voltage from an electron gun (e.g. cold field emission gun or a Schottky thermally assisted field emission gun). The electron beam is focused (equivalently referred to as converged or demagnified) by passing the electron beam through a magnetic field of converging lens 104A and 104B. The electron beam is further focused by the objective lens 105 to form an electron probe. Finally, the electron probe is horizontally positioned on the specimen 108 by the beam deflection coils 106 and/or by physical positioning of the specimen 108.

The electron beam transmitted through and scattered by the specimen 108 is passed through projection lenses 110 and 112, and then detected by the detector 114. The detector 114 comprises a bright field (BF) detector and an annular dark field (ADF) detector. The BF detector detects the direct transmitted electron beam through the specimen 108, while the ADF detector detects the electron beam scattered by the specimen 108. As discussed in greater detail below, the image is acquired by scanning the specimen 108 with an electron probe using the beam deflection coils 106 and changing the strength of the condenser lens 105. A computer system (not shown in FIG. 1 so as to not to unduly complicate the figure) synchronized with the scanning of the specimen 108 forms a scanning transmitted image.

Figure 2C:
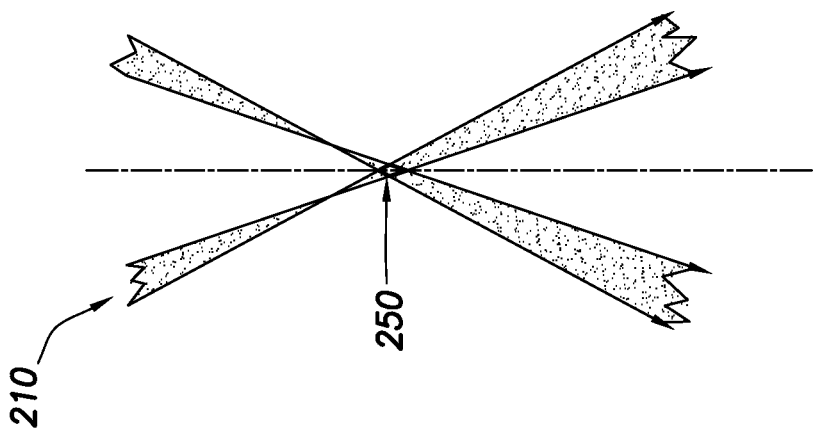
FIG. 2C shows an electron probe in accordance with at least some embodiments.

The resolution (i.e. spatial) of the system 100 is limited by the electron probe size, and the electron probe size is affected by aberration of the lenses 104A, 104B and 105. Due to aberration, the electron probe may be diffused along the longitudinal axis and the latitudinal axis of the electron beam. FIG. 2A illustrates an electron probe 203 diffused at least along the longitudinal axis of the electron beam 202. The diffusion of the electron probe 203 is caused at least in part by chromatic and/or spherical aberration of the lenses 104A, 104B and 105. In accordance with the various embodiments, the aberration of the magnetic lenses is reduced, at least in part, by annular aperture 118, resulting in an electron probe smaller than previously achievable.

Figure 2B:
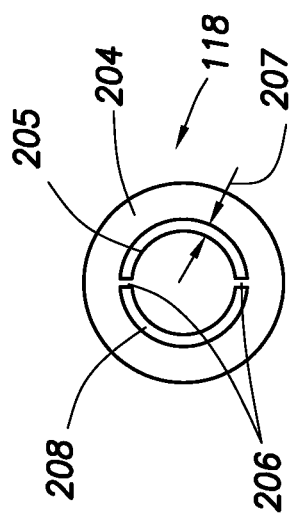
FIG. 2B shows an annular aperture in accordance with at least some embodiments.
Figure 2A:
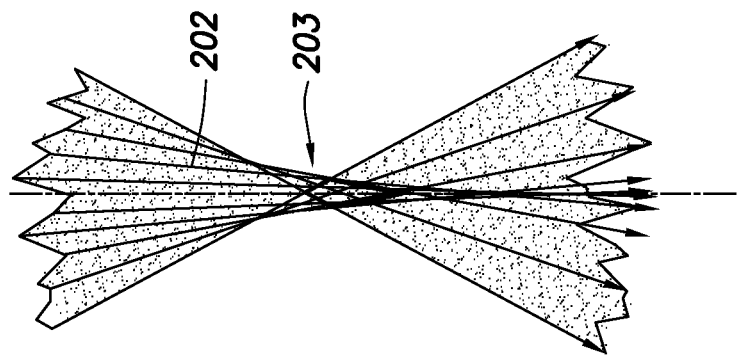
FIG. 2A shows an electron probe.

FIG. 2B illustrates an overhead elevation view of annular aperture 118 in accordance with at least some embodiments. In particular, annular aperture 118 comprises an outer portion 204 and an inner portion 205. Outer portion 204 is shown in FIG. 2B as a ring; however, other shapes may be equivalently used. Likewise, inner portion 205 is shown to be circularly symmetric, but other shapes may be equivalently used. The outer portion 204 and the inner portion 205 are separated by uniform width 207 to create an opening 208 which, in this particular example, is also circularly symmetric. The outer portion 204 and the inner portion 205 are bridged (e.g., at locations 206) to prevent movement between the inner and outer portions. The annular aperture 118 is made of a heavy metal (e.g. Molybdenum, Platinum, or Tungsten) capable of blocking the electron beam, and the annular aperture 118 is grounded to prevent charge accumulation.

Referring simultaneously to FIG. 1 (which shows the annular aperture in cross-section) and 2B (which shows an overhead elevation view), in accordance with at least some embodiments annular aperture 118 is situated co-axially with the electron beam. The annular aperture 118 may be moved (i.e. by mechanical control) in the horizontal direction to align the center of the inner portion 205 of the annular aperture 118 with the optical axis of the electron beam. Annular aperture 118 enables only the portion of the electron beam incident on the opening 208 to pass, and the remaining portion of the electron beam is blocked by the outer portion 204 and inner portion 205. The result is an electron beam confined to a hollow-core or hollow-cone geometry. When focused to create an electron probe, the hollow-cone electron beam creates an electron probe with less diffusion along the longitudinal axis.

FIG. 2C illustrates a cross-sectional elevation view of a hollow-cone electron beam 210 focused to create electron probe 250. As illustrated by reference briefly to FIG. 2A, the electron probe 250 is significantly smaller than the electron probe 203 formed by a solid-cone electron beam. The smaller size of the electron probe 250 is due in part to the aberration reduction provided by the annular aperture 118, and also due in part to use of a hollow-cone electron beam enabling the electron beam to converge at larger angles (measured from the axis of the electron beam).

While in some embodiments use of the annular aperture 118 alone may significantly reduce the electron probe 250 size by reducing aberration and resultant diffusion, some aberration (and thus diffusion) may still be present. The aberration that remains may be equivalently thought of as the portion of the aberration from lenses 104A, 104B and 105 that remains after the aberration reduction by the annular aperture 118. The amount of remaining aberration is proportional to the angular range of the electron beam that passes through opening 208 of the annular aperture. Stated otherwise, the amount of remaining aberration is related to width 207 of the opening 208.

In accordance with some of the embodiments, a diverging lens 120 (FIG. 1) is used to correct at least some of the remaining aberration (and resulting diffusion). The diverging lens 120 is a magnetic lens situated co-axially with the hollow-cone electron beam at a location after the annular aperture 118 and before the specimen 108. The diverging lens 120 diverges a hollow-cone electron beam, and in the embodiments of FIG. 1 the diverging lens 120 diverges the hollow-cone electron beam prior to the beam passing through the deflection coils 106. FIG. 3A shows an overhead view of the diverging lens 120. In particular, FIG. 3A shows that the diverging lens 120 is, in some embodiments, rotationally symmetric (i.e. circular), with the portion is dashed lines illustrating internal features not actually visible in the overhead view. FIG. 3B shows a cross-sectional elevation view of the diverging lens 120 taken along line 3B-3B of FIG. 3A. In particular, the diverging lens 120 comprises a body member 301, made of soft iron (or any other ferromagnetic substance).

In order to avoid charge accumulation on the metallic members of the diverging lens 120, the body member 301 may be electrically grounded. The diverging lens 120 further comprises a solid core 302 within the body member 301 (e.g., at the center of the body member 301) and with air gaps 304 defining edges. In order to create magnetic flux through the body member 301, an electrical coil 303 wound around the core 302 is excited by way of an electrical current. The electric current generates a magnetic field across the air gaps 304. Because of fringing of the magnetic field outside the of the air gaps 304, a hollow-cone electron beam 300 passing through the magnetic field 306 diverges to the outside of the lens 120, as illustrated in FIG. 3B.

The diverging lens 120, like magnetic lenses 104A-104B and 105, has inherent spherical and chromatic aberrations. As illustrated in FIG. 3B, the portion of the electron beam closest to the gaps 304 diverges more than portions of the electron beam that pass further away from the gaps 304. The spherical aberration of the diverging lens 120 is substantially opposite that of the converging magnetic lenses 104A-104B and 105, and by adjusting the strength of the magnetic field of the diverging lens 120 (i.e. by the current applied to the electrical coil 303), the spherical aberration(s) caused by lenses 104A, 104B and 105 may be substantially cancelled by the diverging lens 120. Likewise, chromatic aberration in the diverging lens 120 cancels with the chromatic aberration of the magnetic lenses 104A-104B and 105.

Returning to FIG. 1, the resolution of the system 100 is controlled, at least in part, by the electron probe size, and the electron probe size is limited by the aberrations of the magnetic lens. The electron probe formed by system 100 has small horizontal and vertical dimensions, as the aberrations are limited and/or corrected by the annular aperture 118 and the diverging lens 120. As a result, the system 100 is capable of performing high resolution three-dimensional imaging by scanning the specimen 108 with the electron probe in both horizontal and vertical directions.

The scanning of the specimen 108 with the electron probe is controlled by the objective lens 105 and the beam deflector coils 106. In particular, changing the strength of the deflector coils 106 enables scanning of the specimen 108 in the horizontal direction, and changing the strength of the objective lens 105 enables scanning of the specimen 108 in the vertical direction (i.e. through its thickness). The detector 114 detects the electron beams transmitted through and/or scattered by scanning the specimen 108 with the electron probe.

Figure 4:
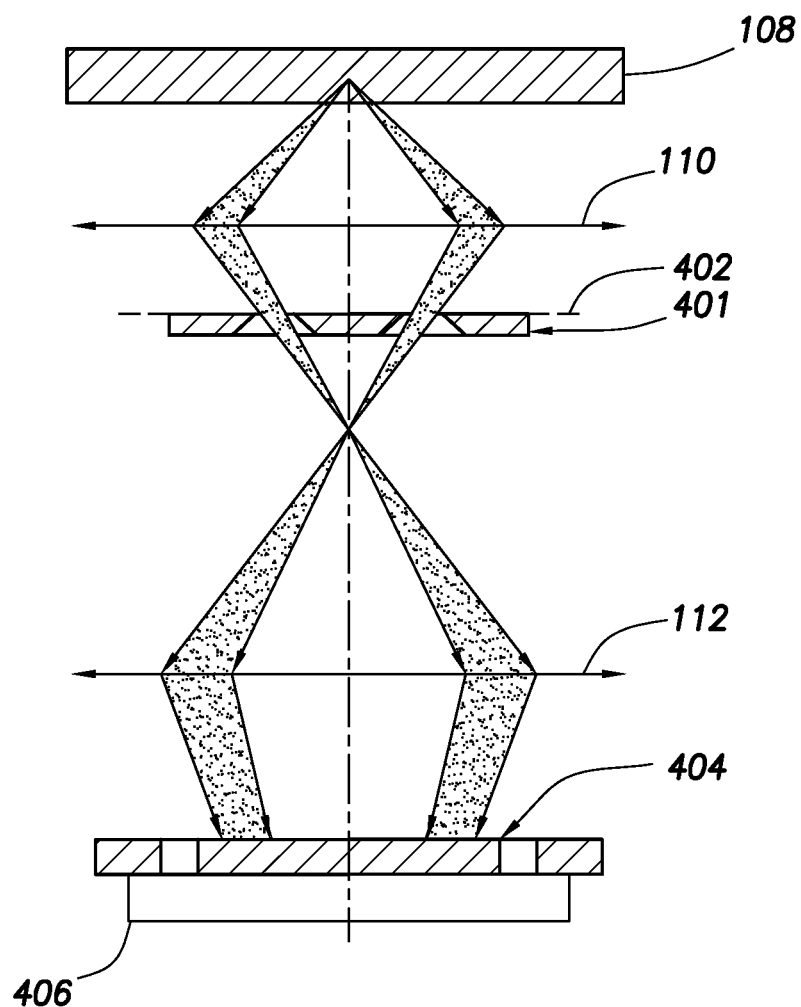
FIG. 4 shows a partial STEM system in accordance with at least some embodiments.

In FIG. 1, the electron beam passes through specimen 108, through the projection lenses 110 and 112, and then to the detector 114. In other embodiments, the electron beam may pass through further annular apertures before being incident upon the detector. FIG. 4 shows such other embodiments for detecting the direct transmitted electron beam and the scattered electron beams by the detector 114. In particular, FIG. 4 shows an annular aperture 401 situated substantially at the back focal plane 402 between the post-field objective lens 110 and projection lens 112. The annular aperture 401 blocks the scattered electron to provide a filtered image at the bright field detector 404. In yet another embodiment, the annular aperture 401 blocks the direct transmitted electron beams to provide a cleaner image at the annular dark field detector 406.

FIG. 5 shows a method in accordance with at least some embodiments. In particular, the method starts (block 500) and moves to generating an electron beam (block 504). Next, a hollow-cone electron beam is created (block 508) by passing the electron beam through a annular aperture. Thereafter, the hollow-cone electron beam is focused to form a probe (block 512). Next, a specimen is scanned using the probe (block 516). Finally, three-dimensional imaging is performed based on the scanning (block 520), and the method ends (block 524).

The above discussion is meant to be illustrative of the principles and various embodiments of the present invention. Numerous variations and modifications will become apparent to those skilled in the art once the above disclosure is fully appreciated. For example, the three-dimensional imaging may be performed using a scanning transmission electron microscope, or the three-dimensional imaging may be performed with any other types of electron microscope (e.g. scanning electron microscope (SEM)). Moreover, the various embodiments are discussed with both the annular aperture and diverging lens; however, in other embodiments the annular aperture may be used without the diverging lens. Finally, while in the various embodiments discussed the three-dimensional imaging of a specimen, in other embodiments three-dimensional electron energy loss spectroscopy (EELS) analysis of a specimen may be performed. Finally, the figures illustrate only one annular aperture situated in the electron microscope prior to specimen; however, in other embodiments additional annular apertures may be situated in the electron beam prior to the specimen as well. It is intended that the following claims be interpreted to embrace all such variations and modifications.

What is claimed is:

1. A method comprising:
    performing three-dimensional imaging of a specimen using a scanning electron microscope by:
        creating a hollow-cone electron beam;
        focusing the hollow-cone electron beam to form a probe; and
        scanning the specimen using the probe;
        wherein focusing the hollow-cone electron beam comprises passing the hollow-cone electron beam through a converging lens after creating the hollow-cone electron beam, directing the hollow-cone electron beam directly to a diverging lens from the converging lens after passing the hollow-cone electron beam through the converging lens, and then passing the hollow-cone electron beam through the diverging lens after directing the hollow-cone electron beam directly to the diverging lens from the converging lens.

2. The method according to claim 1 wherein creating the hollow-cone electron beam further comprises blocking a center portion of the electron beam.

3. The method according to claim 2 wherein blocking further comprises passing the electron beam through a first annular aperture.

4. The method according to claim 1 wherein passing the hollow-cone electron beam through the converging lens comprises passing the hollow-cone electron beam through a converging magnetic lens.

5. The method as defined in claim 1 wherein passing the hollow-cone electron beam through the diverging lens comprises passing the hollow-cone electron beam through a diverging magnetic lens.

6. The method as defined in claim 1 further comprising passing the hollow-cone electron beam through an annular aperture after the hollow-cone electron beam has passed through the specimen.

7. A scanning electron microscope comprising:
    an electron source configured to generate an electron beam;
    a first aperture in operational relationship to the electron beam, the first aperture configured to block a portion of the electron beam to produce a hollow beam;
    a plurality of magnetic lenses in operational relationship to the hollow beam and located between the first aperture and a location of a specimen, the plurality of magnetic lenses configured to focus the hollow beam into an electron probe; and
    a detector configured to detect electrons that pass through the specimen;
    wherein the plurality of magnetic lenses comprises a converging magnetic lens and a diverging magnetic lens located between the converging magnetic lens and the location of the specimen;
    wherein the diverging magnetic lens receives the hollow beam directly from the converging magnetic lens; and
    wherein the scanning electron microscope is configured to scan the specimen using the electron probe.

8. The scanning electron microscope as defined in claim 7 wherein the scanning electron microscope is configured to perform three-dimensional imaging of the specimen.

9. The scanning electron microscope as defined in claim 7 wherein the scanning electron microscope is configured to scan the specimen in a horizontal direction and a vertical direction.

10. The scanning electron microscope as defined in claim 7 wherein the first aperture further comprises an annular aperture.

11. The scanning electron microscope as defined in claim 10 wherein the annular aperture is configured to block a center portion and an outer portion of the electron beam.

12. The scanning electron microscope as defined in claim 7 wherein the first aperture further comprises an inner circular disk and an outer ring to create a ring opening.

13. The scanning electron microscope as defined in claim 7 further comprising a second aperture between the location of the specimen and the detector, the second aperture configured to partially block electrons that pass through the specimen.

14. The scanning electron microscope as defined in claim 13 wherein the second aperture further comprises a ring opening aperture.

15. A method of operating a scanning electron microscope comprising:
    creating a hollow-cone electron beam;
    converging the hollow-cone electron beam using a converging lens;
    directing the converged hollow-cone electron beam directly to a diverging lens from the converging lens after converging the hollow-cone electron beam using the converging lens; and
    diverging the converged hollow-cone electron beam using the diverging lens after directing the converged hollow-cone electron beam directly to the diverging lens from the converging lens and prior to passing the electron beam through a specimen.

16. The method according to claim 15 wherein diverging further comprises passing the hollow-cone electron beam through a magnetic field of the diverging lens.

17. The method according to claim 15 wherein diverging further comprises correcting an aberration.

18. The method according to claim 17 wherein correcting an aberration further comprises correcting at least one aberration selected from the group consisting of: chromatic aberration and spherical aberration.

19. A method comprising:
    performing three-dimensional imaging of a specimen using a scanning electron microscope by:
        generating a first electron beam;
        passing the first electron beam through a series of first converging lenses;

creating a hollow-cone electron beam from the first electron beam by blocking a center portion of the first electron beam after passing the first electron beam through the series of first converging lenses;

focusing the hollow-cone electron beam to form a probe; and scanning the specimen using the probe;

wherein focusing the hollow-cone electron beam comprises passing the hollow-cone electron beam through a second converging lens after creating the hollow-cone electron beam, directing the hollow-cone electron beam directly to a diverging lens from the second converging lens after passing the hollow-cone electron beam through the second converging lens, and then passing the hollow-cone electron beam through the diverging lens after directing the hollow-cone electron beam directly to the diverging lens from the converging lens.

20. The method as defined in claim 19 wherein passing the hollow-cone electron beam through the diverging lens comprises passing the hollow-cone electron beam through a diverging magnetic lens.

21. The method as defined in claim 20 wherein passing the hollow-cone electron beam through the second converging lens comprises passing the hollow-cone electron beam through a converging magnetic lens.

22. The method according to claim 19 wherein blocking a center portion of the first electron beam further comprises passing the first electron beam through a first annular aperture.

23. The method as defined in claim 19 further comprising passing the hollow-cone electron beam through an annular aperture after the hollow-cone electron beam has passed through the specimen.

24. The method according to claim 1, wherein scanning the specimen using the probe comprises moving the probe through a thickness of the specimen.

25. The method according to claim 24, wherein the converging lens is a converging magnetic lens and moving the probe through the thickness of the specimen occurs in response to changing a strength of the converging magnetic lens.

26. The scanning electron microscope as defined in claim 7, wherein the converging magnetic lens is configured to move the electron probe through a thickness of the specimen.

* * * * *